(12) United States Patent
Lee et al.

(10) Patent No.: US 8,093,804 B2
(45) Date of Patent: Jan. 10, 2012

(54) ORGANIC ELECTROLUMINESCENT DISPLAY DEVICE HAVING A NOVEL CONCEPT FOR LUMINOUS EFFICIENCY

(75) Inventors: Hyun-Ho Lee, Seoul (KR); Young-Hoon Sohn, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 12/855,509

(22) Filed: Aug. 12, 2010

(65) Prior Publication Data
US 2011/0121717 A1     May 26, 2011

(30) Foreign Application Priority Data

Nov. 23, 2009  (KR) ................. 10-2009-0113399

(51) Int. Cl.
*H01L 51/00*     (2006.01)
(52) U.S. Cl. .......... 313/504; 313/506; 313/507; 445/24; 445/25; 427/66; 438/26; 438/27; 438/28; 438/29

(58) Field of Classification Search .......... 313/498–512; 315/169.1–169.3; 438/26–29, 34, 82; 427/66, 427/532–535, 539; 435/24–25
See application file for complete search history.

(56) References Cited

FOREIGN PATENT DOCUMENTS
KR     1020090005541     1/2009

*Primary Examiner* — Anne Hines
*Assistant Examiner* — Tracie Green
(74) *Attorney, Agent, or Firm* — McKenna Long & Aldridge, LLP (57) ABSTRACT

An organic electroluminescent display device includes: a first substrate having an active area displaying images and a non-active area surrounding the active area; a switching thin film transistor and a driving thin film transistor connected to the switching thin film transistor in the active area on the first substrate; an organic electroluminescent diode connected to the driving thin film transistor; a dummy metal pattern at a corner portion of the non-active area on the first substrate; a second substrate facing and spaced apart from the first substrate, the second substrate including a groove; and a seal pattern attaching the first and second substrates, wherein the dummy metal pattern overlaps a residue at a corner portion of the groove.

8 Claims, 7 Drawing Sheets

FIG. 6A light leakage

FIG. 6B no light leakage

ORGANIC ELECTROLUMINESCENT DISPLAY DEVICE HAVING A NOVEL CONCEPT FOR LUMINOUS EFFICIENCY

The present application claims the benefit of Korean Patent Application No. 10-2009-0113399 filed in Korea on Nov. 23, 2009, which is hereby incorporated by reference in its entirety.

BACKGROUND OF THE INVENTION

1. Field of the Invention

The present invention relates to an organic electroluminescent display (ELD) device, and more particularly, to an organic electroluminescent display device where a display quality is improved by preventing a light leakage.

2. Discussion of the Related Art

Although a cathode ray tube (CRT) was widely used as a display device, a flat panel display (FPD) such as a plasma display panel (PDP) device, a liquid crystal display (LCD) device and an organic electroluminescent display (ELD) device, which may be referred to as an organic light emitting diode (OLED) device, has been the subject of recent research and development.

Among various FPD devices, organic ELD devices of an emissive type have advantages of a light weight and a thin profile due to omission of a backlight unit. In addition, organic ELD devices have a viewing angle and a contrast ratio superior to LCD devices, and have advantages in a power consumption such that organic ELD devices are driven with a low direct current (DC) voltage. Further, organic ELD devices have a fast response speed, an excellent durability against an external impact and a wide operation temperature range. Specifically, since the fabrication process for organic ELD devices is simple, organic ELD devices have a lower production cost as compared with LCD devices.

Organic ELD devices may be classified into a passive matrix type and an active matrix type according to existence of a switching element. In passive matrix type organic ELD devices, a scan line and a signal line crossing each other to define a pixel region are disposed in a matrix without a switching element. In active matrix type organic ELD devices, a scan line and a signal line crossing each other to define a pixel region are disposed in a matrix and a thin film transistor (TFT) as a switching element and a storage capacitor are disposed in each pixel region.

Since passive matrix type organic ELD devices have disadvantages in resolution, power consumption and lifetime, active matrix type organic ELD devices having advantages of high resolution and large size have been the subject of recent research and development.

Figure 1:
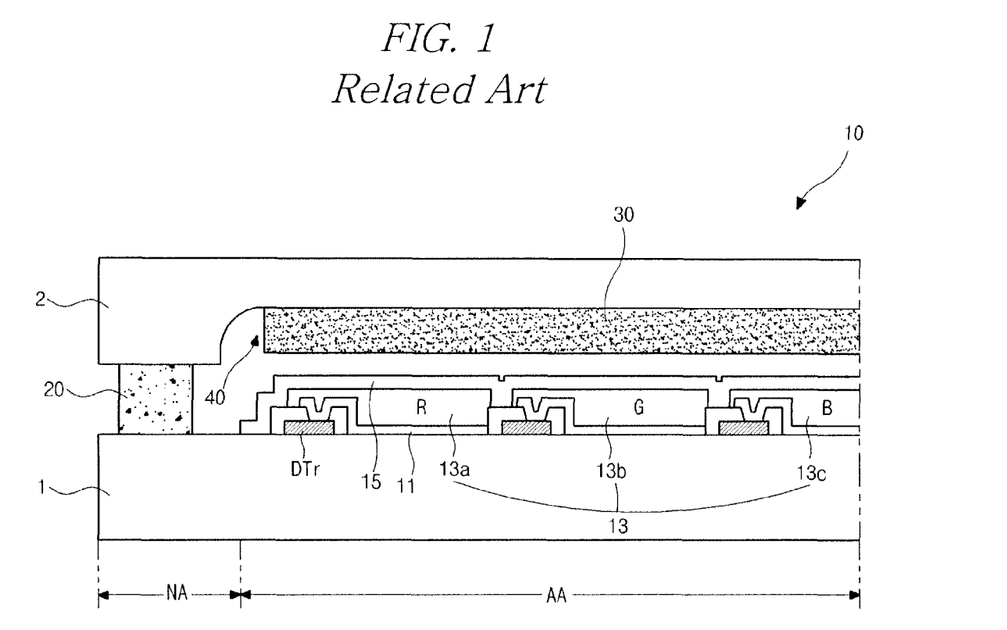
FIG. 1 is a cross-sectional view showing an active matrix type organic electroluminescent display panel according to the related art.

FIG. 1 is a cross-sectional view showing an active matrix type organic electroluminescent display panel according to the related art. In FIG. 1, an organic electroluminescent display (ELD) device 10 includes first and second substrates 1 and 2 facing and spaced apart from each other, and the first and second substrates 1 and 2 are attached to each other with a seal pattern 20 at an edge portion of the first and second substrates 1 and 2. The first substrate 1 includes an active area AA for displaying images and a non-active area NA surrounding the active area AA.

A driving thin film transistor (TFT) DTr is formed on the first substrate 1 in the active area. In addition, a first electrode 11, an organic luminescent layer 13 and a second electrode 15 constituting an organic electroluminescent (EL) diode E are sequentially formed on the first substrate 1. The first electrode 11 is electrically connected to the driving TFT DTr. The first and second electrodes 11 and 15 may function as an anode and a cathode, respectively. The organic luminescent layer 13 includes red, green and blue organic luminescent patterns 13a, 13b and 13c in each pixel region.

When the organic ELD device 10 has a bottom emission type, the first electrode 11 may be formed of a transparent conductive material and the second electrode 15 may be formed of a conductive material so that light from the organic luminescent layer 13 can be emitted through the first electrode 11. The second substrate 2 includes a groove 40 and an absorbent material 30 is formed in the groove 40 to eliminate moisture penetrated from exterior.

The groove 40 is formed by etching the second substrate 2 using a mask. The groove 40 has a rectangular shape and corner portions of the rectangular shape may have residues due to incomplete etching.

Figure 2A:
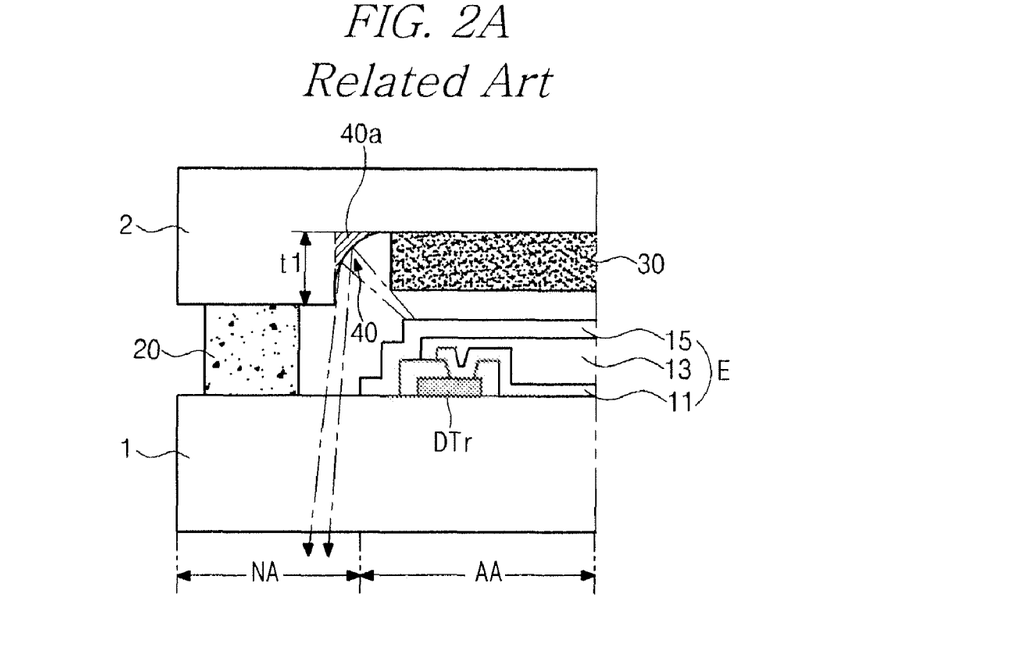
FIG. 2A is a cross-sectional view showing a light leakage at a corner portion of an organic electroluminescent display device according to the related art.
Figure 2B:
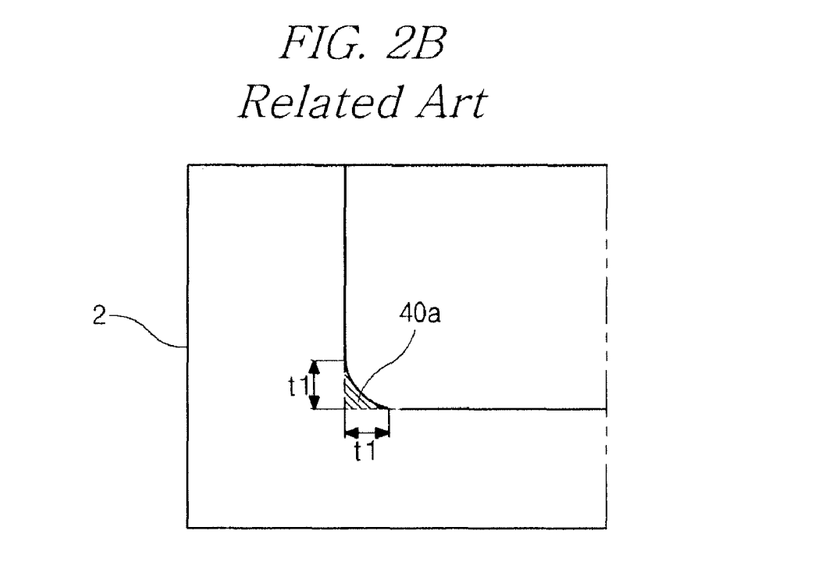
FIG. 2B is a plan view showing residues in a second substrate for an organic electroluminescent display device according to the related art.

FIG. 2A is a cross-sectional view showing a light leakage at a corner portion of an organic electroluminescent display device according to the related art, and FIG. 2B is a plan view showing residues in a second substrate for an organic electroluminescent display device according to the related art. In FIGS. 2A and 2B, a first substrate having a driving TFT DTr and an organic EL diode E is attached to a second substrate 2 with a seal pattern 20. The second substrate 2 includes a groove 40 and an absorbent material 30 is formed in the groove 40. The groove 40 has a rectangular shape and has a first depth t1 from an inner surface of second substrate 2.

The groove 40 may be formed by etching the second substrate 2 using a mask, and residues 40a may be formed at corner portions of the groove 40 due to a slower flow of an etching source. Accordingly, a sidewall and a bottom surface of the groove 40 form a right angle in a side portion except the corner portions, while the sidewall and the bottom surface of the groove 40 form a rounded angle due to the residues 40a in the corner portions. Each residue 40a may have sides each corresponding to the first depth t1 from the corner point.

The residues 40a cause a light leakage, and display quality such as brightness and color uniformity of the organic ELD device 10 is degraded due to the light leakage. The light from the organic luminescent layer 13 may be emitted to the residues 40a through the second electrode 15. In addition, the light is reflected and refracted at the residues 40a, and is transmitted to the first substrate 1. As a result, the light through the second electrode 15, which is undesired light, is emitted from the organic ELD device 10 to form the light leakage.

SUMMARY OF THE INVENTION

Accordingly, the present invention is directed to an organic electroluminescent display device that substantially obviates one or more of the problems due to limitations and disadvantages of the related art.

An object of the present invention is to provide an organic electroluminescent display device where a light leakage is prevented.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes: a first substrate having an active area displaying images and a non-active area surrounding the active area; a switching thin film transistor and a driving thin film transistor connected to the switching thin film transistor in the active area on the first substrate; an organic electroluminescent diode connected to the driving thin film transistor; a dummy metal pattern at a corner portion of the non-active area on the first substrate; a second substrate facing and spaced apart from the first substrate, the second substrate including a groove; and a seal pattern attaching the first and second substrates, wherein the dummy metal pattern overlaps a residue at a corner portion of the groove.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the preferred embodiments, examples of which are illustrated in the accompanying drawings.

Figure 3:
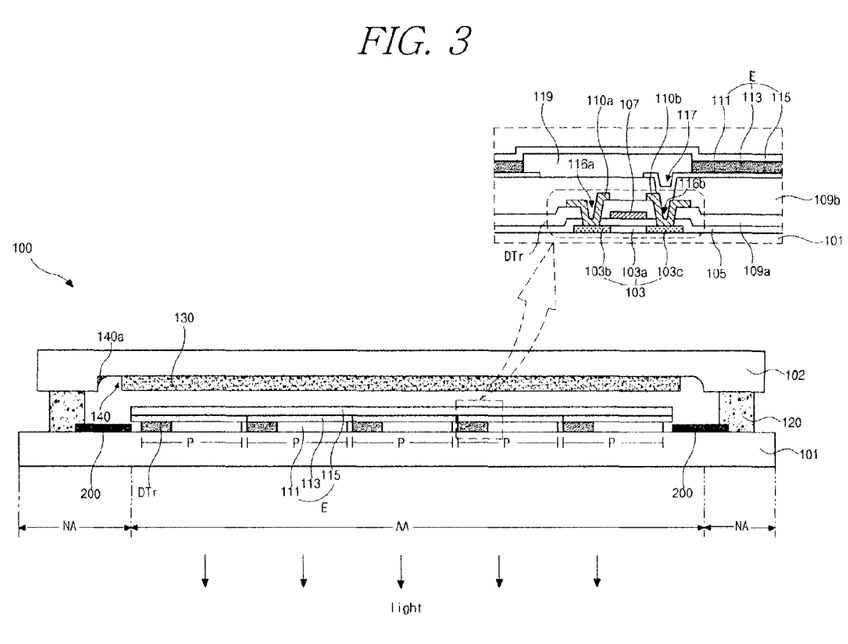
FIG. 3 is a cross-sectional view showing an organic electroluminescent display device according to an embodiment of the present invention.

FIG. 3 is a cross-sectional view showing an organic electroluminescent display device according to an embodiment of the present invention.

In FIG. 3, an organic electroluminescent display (ELD) device 100 has a bottom emission type. Organic ELD devices may be classified into a top emission type and a bottom emission type. Since the bottom emission type organic ELD device has advantages in stability and degree of freedom for fabrication, the bottom emission type organic ELD device has been widely researched.

The organic ELD device 100 includes first and second substrates 101 and 102 facing and spaced apart from each other, and the first and second substrates 101 and 102 are attached to each other with a seal pattern 120 at an edge portion of the first and second substrates 101 and 102. The first substrate 101 includes an active area AA for displaying images and a non-active area NA surrounding the active area AA. Although not shown in FIG. 3, a gate line, a data line and a power line are formed on an inner surface of the first substrate 101 in the active area AA, and the gate line and the data line cross each other to define a pixel region P. A switching thin film transistor (TFT) (not shown), a driving TFT DTr and an organic electroluminescent (EL) diode E are formed on the inner surface of the first substrate 101 in each pixel region P. The switching TFT is connected to the gate line and the data line, and the driving TFT DTr is connected to the switching TFT and the power line. The organic EL diode E includes a first electrode 111, an organic luminescent layer 113 and the second electrode 115. Further, a groove 140 is formed in the second substrate 102, and an absorbent material 130 is formed in the groove 140 to eliminate moisture penetrated from exterior. The second substrate 102 is used for encapsulating the organic EL diode E of the first substrate 101.

A semiconductor layer 103 of silicon is formed on the inner surface of the first substrate 101, and a gate insulating layer 105 is formed on the semiconductor layer 103. The semiconductor layer 103 includes an active region 103a of intrinsic silicon and source and drain regions 103b and 103c of impurity-doped silicon. The active region 103a is used as a channel region and the source and drain regions 103b and 103c are disposed at both sides of the active region 103a. A gate electrode 107 connected to the gate line is formed on the gate insulating layer 105. In addition, a first interlayer insulating layer 109a is formed on the gate electrode 107 and the gate line. The first interlayer insulating layer 109a and the gate insulating layer 105 include first and second semiconductor contact holes 116a and 116b exposing the source and drain regions 103b and 103c, respectively.

Source and drain electrodes 110a and 110b are formed on the first interlayer insulating layer 109a. The source electrode 110a is connected to the source region 103b through the first semiconductor contact hole 116a, and the drain electrode 110b is connected to the drain region 103c through the second semiconductor contact hole 116b. The semiconductor layer 103, the gate insulating layer 105, the gate electrode 107, the source electrode 110a and the drain electrode 110b constitute the driving TFT DTr. Moreover, the data line is formed on the first interlayer insulating layer 109a. The switching TFT may have the same structure as the driving TFT DTr. Although each of the switching TFT and the driving TFT DTr has a top gate type where a gate electrode is formed over a semiconductor layer in the embodiment of FIG. 3, each of the switching TFT and the driving TFT DTr may have a bottom gate type where a semiconductor layer is formed over a gate electrode in another embodiment.

Further, a second interlayer insulating layer 109b is formed on the source and drain electrodes 110a and 110b. The second interlayer insulating layer 109b includes a drain contact hole 117 exposing the drain electrode 110b of the driving TFT DTr. A first electrode 111, an organic luminescent layer 113 and a second electrode 115 are sequentially formed on the second interlayer insulating layer 109b. The first electrode 111, the organic luminescent layer 113 and the second electrode 115 constitute the organic EL diode E. The first electrode 111 is connected to the drain electrode 110b of the driving TFT DTr through the drain contact hole 117.

The first electrode 111 is formed in each pixel region P, and a bank 119 formed on a boundary portion of the first electrode 111 and the second interlayer insulating layer 109b. The bank 119 has a matrix shape including openings and corresponds to a border between the adjacent pixel regions P.

When the organic ELD device 100 has a bottom emission type, the first electrode 111 may include a transparent conductive material such as indium-tin-oxide (ITO) and indium-zinc-oxide (IZO) having a relatively high work function, and the second electrode 115 may include a metallic material such as aluminum (Al) and aluminum alloy (e.g., aluminum neodymium (AlNd)) having a relatively low work function. As a result, the first and second electrodes 111 and 115 function as a cathode and an anode, respectively, and the light from the organic luminescent layer 113 is emitted through the first electrode 111.

The second electrode 115 of a metallic material may be formed by a low temperature deposition method to minimize deterioration of the organic luminescent layer 113. As a result, the second electrode 115 may be degraded to have a low film quality and a high resistivity. The degradation of the second electrode 115 causes deterioration in display quality and power consumption. To solve the above problems of the second electrode 115 of a metallic material, the second electrode 115 may be formed of a double layer of a thin metallic material and a thick transparent conductive material in another embodiment.

The organic luminescent layer 113 may have a single layer or a multiple layer including a hole injecting layer (HIL), a hole transporting layer (HTL), an emitting material layer (EML), an electron transporting layer (ETL) and an electron injecting layer (EIL) for improving emission efficiency.

In the organic ELD device 100, when a voltage of a data signal is applied to the first and second electrodes 111 and 115, the holes injected from the first electrode 111 and the electrons injected from the second electrode 113 are transported to the organic luminescent layer 113, and excitons are generated by the holes and the electrons in the organic luminescent layer 113. In addition, the light is generated in the organic luminescent layer 113 by the transition from an excited state to a ground state of the excitons and is emitted as a visible ray. The light from the organic luminescent layer 113 is emitted through the first electrode 111 so that the organic ELD device 100 can display images.

The second substrate 102 faces and is spaced apart from the first substrate 101. The second substrate 102 may be formed of a glass or a metal foil. The first and second substrates 101 and 102 are attached to each other with the seal pattern 120, thereby the organic EL diode E encapsulated. For example, the seal pattern 120 may be formed of a heat curable resin or an ultraviolet (UV) curable resin.

The first substrate 101 may include one of a glass and a stainless steel. When the organic ELD device 100 has a bottom emission type, the first substrate 101 is formed of glass. The second substrate 102 may include a metal foil. When the second substrate 102 is formed of a metal foil, the thickness of the second substrate 102 is reduced as compared with a second substrate of a glass, and the organic ELD device 100 may have a thinner profile. In addition, durability and heat radiation property of the organic ELD device 100 including the second substrate of a metal foil are improved as compared with an organic ELD device including a second substrate of a glass.

The second substrate 115 includes the groove 140, and the absorbent material 130 such as barium oxide (BaO) and calcium oxide (CaO) is formed in the groove 140. In addition, residues 140a are formed in four corner portions of the groove 140 of the second substrate 102, and dummy metal patterns 200 are formed at four corner portions of the non-active area NA of the first substrate 101 to prevent a light leakage due to the residues 140a.

Figure 4:
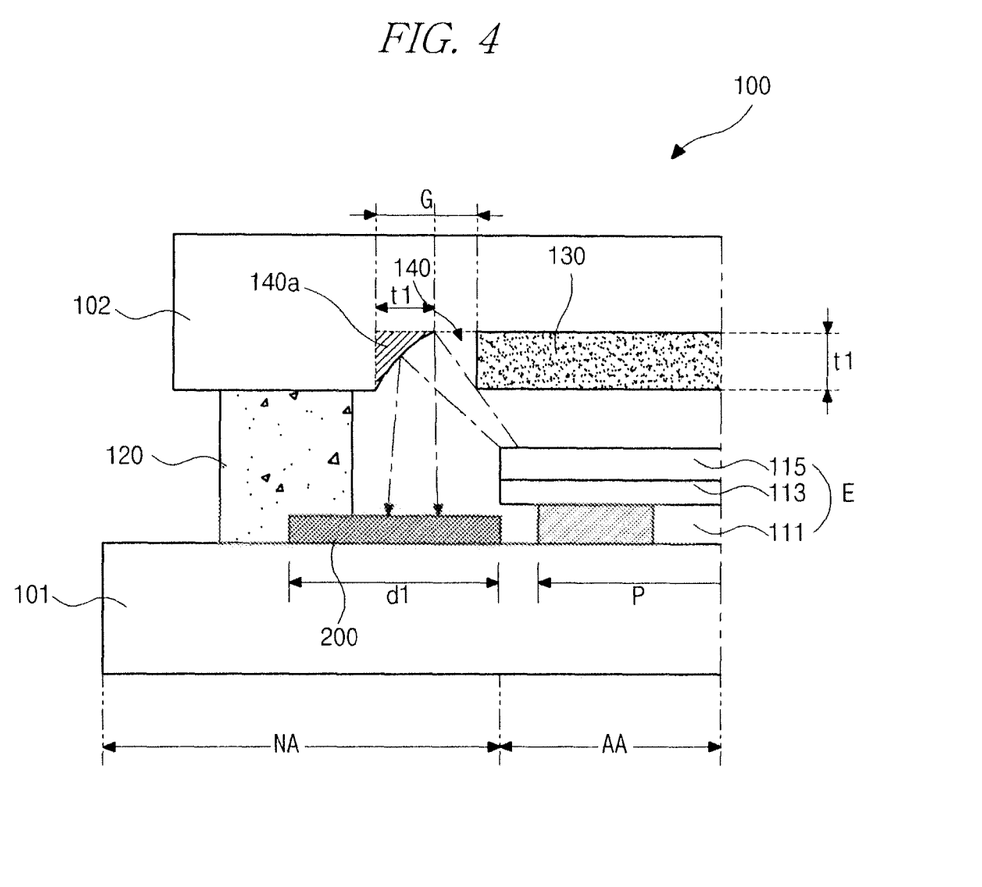
FIG. 4 is a cross-sectional view showing a light leakage prevention at a corner portion of an organic electroluminescent display device according to an embodiment of the present invention.

FIG. 4 is a cross-sectional view showing a light leakage prevention at a corner portion of an organic electroluminescent display device according to an embodiment of the present invention.

In FIG. 4, a dummy metal pattern 200 is formed at each of four corner portions of a non-active area NA of a first substrate 101. In addition, the dummy metal pattern 200 corresponds to a residue 140a at each corner portion G of a groove 140 of a second substrate 102 so that a light leakage due to the residue 140a can be prevented. The groove 140 is formed in the second substrate 102 by an etching method using a mask, and an absorbent material 130 is formed in the groove 140. A flow of an etching source such as an etching solution or an etching gas slows down at a border portion between an etching area (i.e., the groove 140) and a non-etching area (i.e., the second substrate 102 except the groove 140), especially at the four corner portions of the groove 140 as compared with a central portion of the groove 140. As a result, a portion of the second substrate 102 is under-etched to remain as the residue 140a. For example, the residue 140a may have a triangular shape having a rounded base side in plane view. When the groove 140 has a first depth t1, each oblique side of the triangular shape of the residue 140a may a distance corresponding to the first depth t1.

Since an organic ELD device 100 has a bottom emission type, the light from an organic luminescent layer 113 is emitted through a first electrode 111 to display images. In addition, most of the light of the organic luminescent layer 113 through a second electrode 115 is absorbed and dissipated in the organic ELD device 100. However, a part of the light of the organic luminescent layer 113 through the second electrode 115 is reflected and refracted at the residue 140a of each corner portion G to be transmitted to the first substrate 101. The part of the light transmitted to the first substrate 101 is shielded by the dummy metal pattern 200 at each corner portion of the non-active area NA and the light leakage due to reflection and refraction by the residue 140a is prevented. As a result, display quality of the organic ELD device 100 is improved.

The dummy metal pattern 200 may be formed of the same layer and the same material as the gate electrode 107 (of FIG. 3) of the driving TFT DTr (of FIG. 3) or the source and drain electrodes 110a and 110b (of FIG. 3) of the driving TFT DTr. The dummy metal pattern 200 may be formed at each corner portion of the non-active area NA to correspond to the residue 140a at each corner portion G of the groove 140. In addition, the dummy metal pattern 200 may have a triangular shape having a flat base side in plane view, and each oblique side of the triangular shape may have a first distance d1 within a range of about 1.5 times of the first depth t1 to about 2.5 times of the first depth t1. ((1.5)t1≦d1≦(2.5)t1) Since the dummy metal pattern 200 has an area greater than the residue 140a, the dummy metal pattern 200 may be formed between a seal pattern 120 and the first substrate 101 to partially overlap the seal pattern 120.

Figure 5:
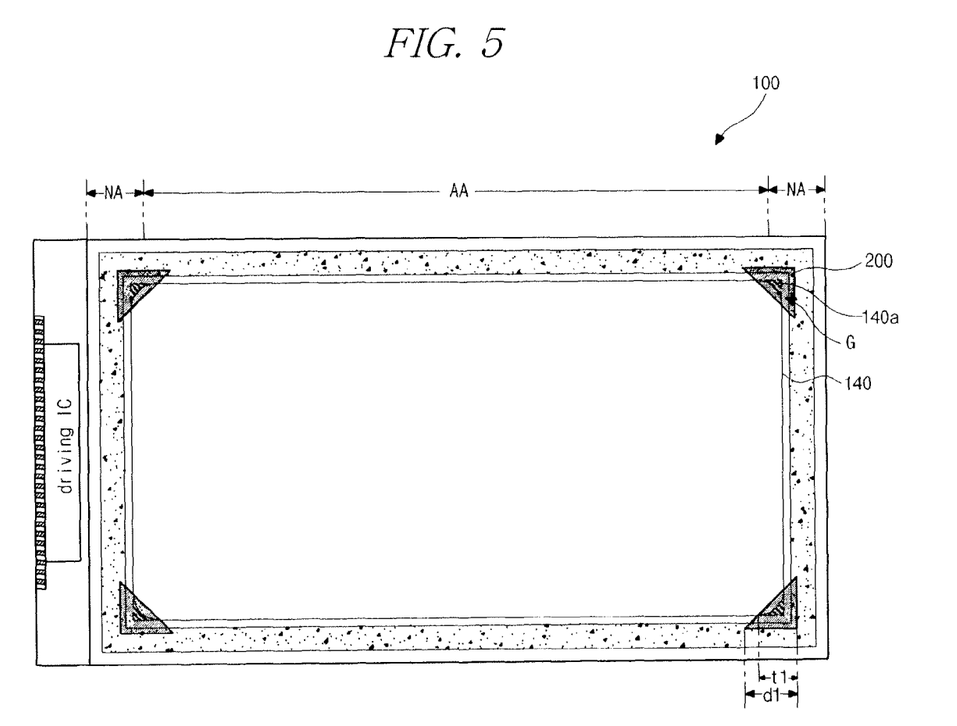
FIG. 5 is a plan view showing an organic electroluminescent display device according to an embodiment of the present invention.

FIG. 5 is a plan view showing an organic electroluminescent display device according to an embodiment of the present invention.

In FIG. 5, a seal pattern 120 is formed on a first substrate 101 (of FIG. 3) in a non-active area NA surrounding an active area AA, and a dummy metal pattern 200 is formed at each corner portion of the non-active area NA to overlap the seal pattern 120. A second substrate 102 includes a groove 140 and a residue 140a is formed at each corner portion G of the groove 140. The dummy metal pattern 200 corresponds to the residue 140a. Accordingly, the dummy metal pattern 200 is formed in the non-active area NA on the first substrate 101 and overlaps the seal pattern 120 and the residue 140a at each corner portion G of the groove 140.

The residue 140a may have a triangular shape having a rounded base side in plane view and the dummy metal pattern 200 may have a triangular shape having a flat base side in plane view. When the groove has a first depth t1, the oblique side of the residue 140a may have a distance corresponding to the first depth t1 and the oblique side of the dummy metal pattern 200 may have a first distance d1 within a range of about 1.5 times of the first depth t1 to about 2.5 times of the first depth t1. $((1.5)t1 \leq d1 \leq (2.5)t1)$ As a result, an area of the dummy metal pattern 200 may be within a range of about 2.25 times of an area of the residue 140a to about 6.25 times of the area of the residue 140a. For example, when the groove has the first depth of about 300 μm, the residue 140a has the oblique side of about 300 μm and the dummy metal pattern 200 has the oblique side within a range of about 450 μm to about 750 μm. As a result, the dummy metal pattern 200 has an equilateral right triangular shape having an area within a range of about 101250 $\mu m^2$ to about 281250 $\mu m^2$.

When the dummy metal pattern 200 has an insufficient area, the light may not be completely shielded. In addition, when the dummy metal pattern 200 has a sufficient area, the light may be completely shielded and the light leakage may be completely prevented. However, as the area of the dummy metal pattern 200 increases, the non-display area NA also increases and the aperture ratio of the organic ELD device 100 is reduced. As a result, the dummy metal pattern 200 may be formed to have an oblique side of the first distance d1 within a range of about 1.5 times of the first depth t1 to about 2.5 times of the first depth t1.

Figure 6A:
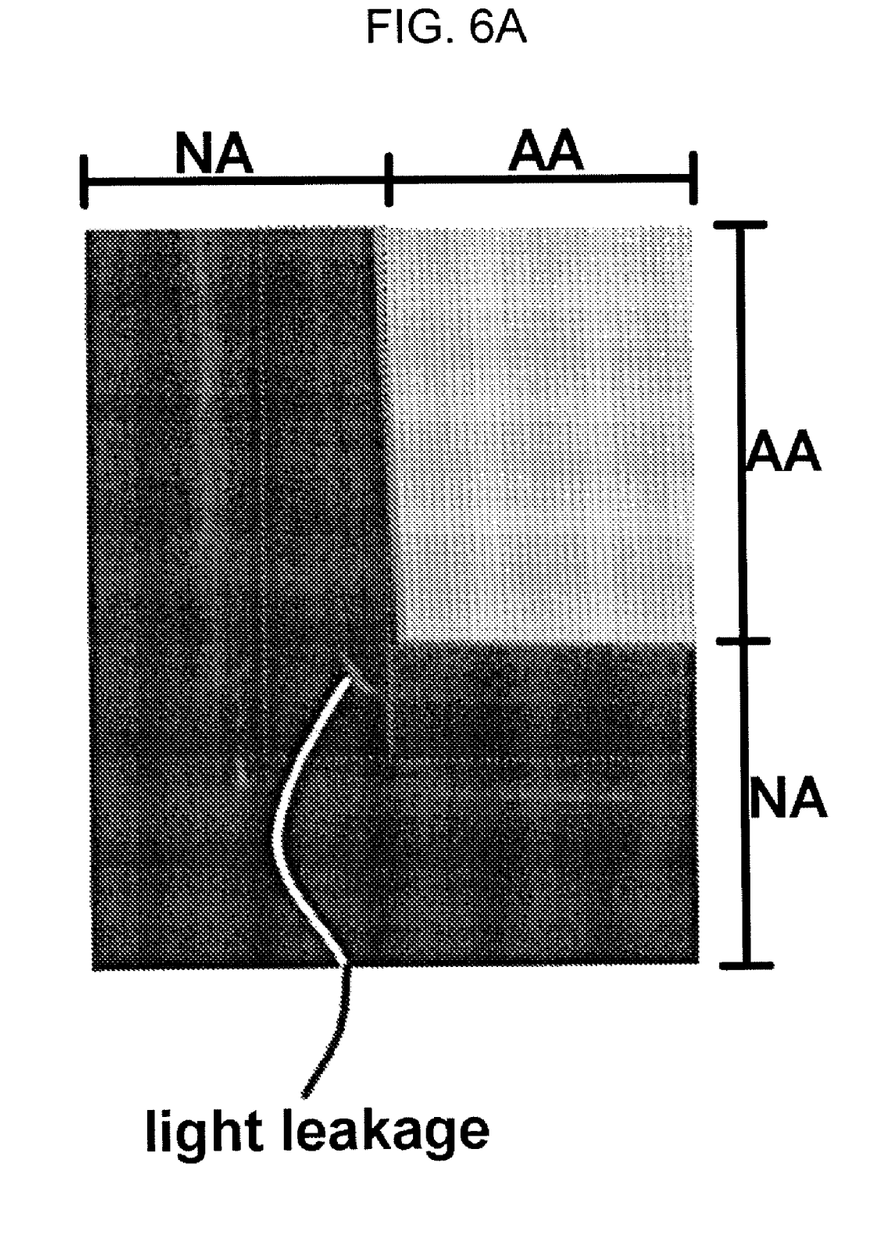
FIG. 6A is a view showing a light leakage in an organic electroluminescent display device according to the related art.
Figure 6B:
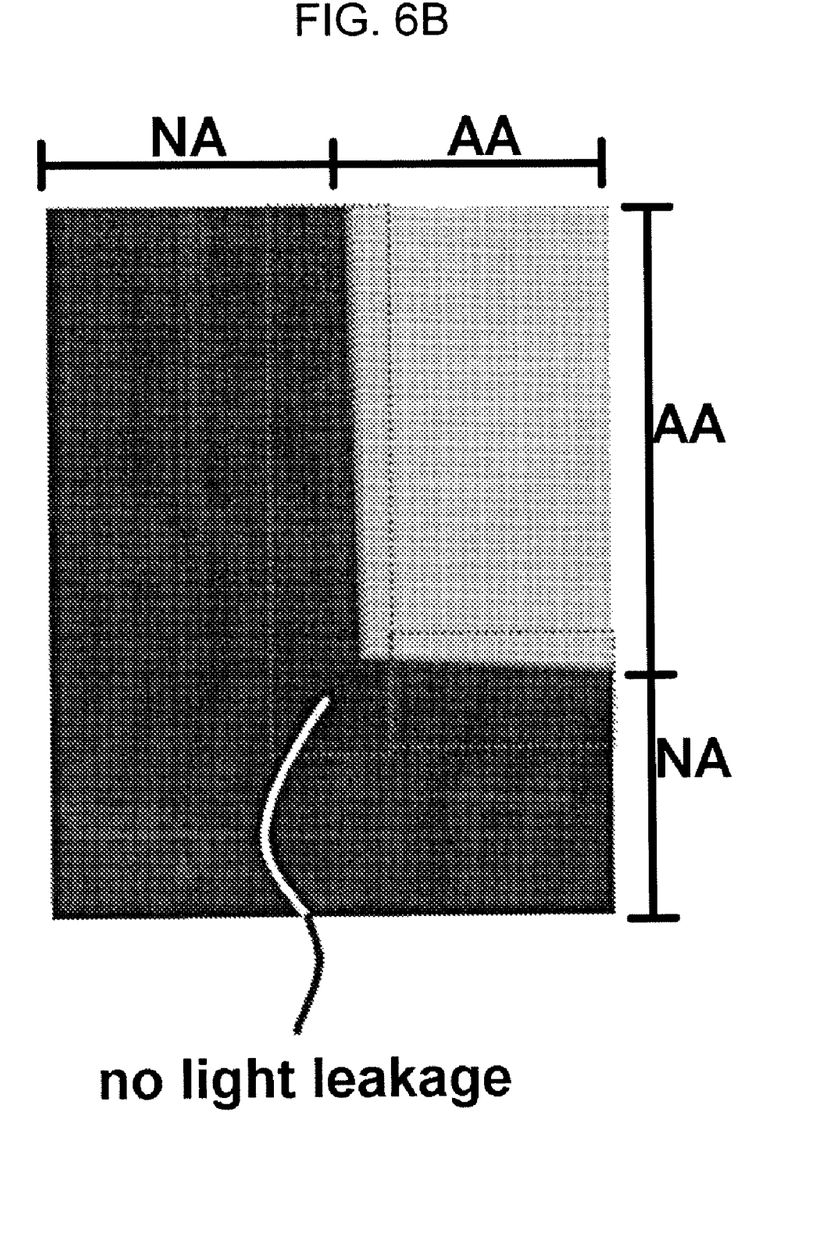
FIG. 6B is a view showing a light leakage prevention in an organic electroluminescent display device according to an embodiment of the present invention.

FIG. 6A is a view showing a light leakage in an organic electroluminescent display device according to the related art, and FIG. 6B is a view showing a light leakage prevention in an organic electroluminescent display device according to an embodiment of the present invention.

In FIG. 6A, a light leakage is inspected at a corner portion of a non-active area NA of an organic ELD device. In FIG. 6B, no light leakage is inspected at a corner portion of a non-active area NA of an organic ELD device. Although the light of the organic luminescent layer through the second electrode is reflected and refracted at the residue at each corner portion of the groove, the reflected and refracted light is shielded by the dummy metal pattern 200 (of FIG. 5) and the light leakage is prevented in the organic ELD device according to an embodiment of the present invention. As a result, display quality such as brightness and color uniformity is improved in the organic ELD device according to an embodiment of the present invention.

Consequently, in an organic electroluminescent display device according to the present invention, a light leakage due to a residue at a corner portion of a groove for absorbent material is prevented by a dummy metal pattern at a corner portion of a non-active area. Accordingly, display quality such as brightness and color uniformity of the organic electroluminescent display device according to the present invention is improved.

It will be apparent to those skilled in the art that various modifications and variations can be made in the organic electroluminescent display device of the present invention without departing from the spirit or scope of the invention. Thus, it is intended that the present invention covers the modifications and variations of this invention provided they come within the scope of the appended claims and their equivalents.

What is claimed is:

1. An organic electroluminescent display device, comprising:
   a first substrate having an active area displaying images and a non-active area surrounding the active area;
   a switching thin film transistor and a driving thin film transistor connected to the switching thin film transistor in the active area on the first substrate;
   an organic electroluminescent diode connected to the driving thin film transistor;
   a dummy metal pattern at a corner portion of the non-active area on the first substrate;
   a second substrate facing and spaced apart from the first substrate, the second substrate including a groove; and
   a seal pattern attaching the first and second substrates,
   wherein the dummy metal pattern overlaps a residue, that is left after using a mask to etch the second substrate and is not removed, at a corner portion of the groove.

2. The device according to claim 1, wherein the dummy metal pattern overlaps the seal pattern.

3. The device according to claim 1, wherein the residue has a triangular shape having a rounded base side and the dummy metal pattern has a triangular shape having a flat base side.

4. The device according to claim 3, wherein the groove has a first depth and an oblique side of the dummy metal pattern has a first distance within a range of about 1.5 times of the first depth to about 2.5 times of the first depth.

5. The device according to claim 4, wherein the dummy metal pattern has an equilateral right triangular shape.

6. The device according to claim 1, wherein the driving thin film transistor includes a semiconductor layer, a gate electrode, a source electrode and a drain electrode.

7. The device according to claim 6, wherein the dummy metal pattern includes a same layer and a same material as the gate electrode.

8. The device according to claim 6, wherein the dummy metal pattern includes a same layer and a same material as the source and drain electrodes.

* * * * *